(12) United States Patent
Völkel

(10) Patent No.: US 8,841,598 B2
(45) Date of Patent: Sep. 23, 2014

(54) OPTICAL SENSOR COMPRISING A PROXIMITY SWITCH

(75) Inventor: Thomas Völkel, Altdorf (DE)

(73) Assignee: Siemens Aktiengesellschaft, Munich (DE)

( * ) Notice: Subject to any disclaimer, the term of this patent is extended or adjusted under 35 U.S.C. 154(b) by 211 days.

(21) Appl. No.: 13/497,877

(22) PCT Filed: Sep. 21, 2010

(86) PCT No.: PCT/EP2010/063847
§ 371 (c)(1),
(2), (4) Date: Mar. 23, 2012

(87) PCT Pub. No.: WO2011/036137
PCT Pub. Date: Mar. 31, 2011

(65) Prior Publication Data
US 2013/0001406 A1  Jan. 3, 2013

(30) Foreign Application Priority Data
Sep. 23, 2009 (DE) .......................... 10 2009 042 609

(51) Int. Cl.
*H01L 31/09* (2006.01)
*H03K 17/94* (2006.01)
*H01L 31/0352* (2006.01)
*H01L 51/00* (2006.01)
*H01L 31/00* (2006.01)
*G01S 17/02* (2006.01)
*G01V 8/14* (2006.01)

(52) U.S. Cl.
CPC .......... *H03K 17/941* (2013.01); *H01L 31/0352* (2013.01); *H01L 51/00* (2013.01); *H01L 31/00* (2013.01); *G01S 17/026* (2013.01); *G01V 8/14* (2013.01); *H03K 2217/94108* (2013.01)
USPC ........... 250/221; 250/214.1; 250/551; 257/40

(58) Field of Classification Search
CPC . H01L 31/00; H01L 31/0248; H01L 31/0325; H01L 51/00
USPC ................... 250/221, 222.1, 205, 214.1, 551; 345/173, 175; 257/40
See application file for complete search history.

(56) References Cited

U.S. PATENT DOCUMENTS 5,262,636 A  11/1993 Rink
5,698,048 A * 12/1997 Friend et al. .................. 136/263

(Continued)

FOREIGN PATENT DOCUMENTS

| DE | 102 06 907 | 9/2003 |
| DE | 102006025469 | 12/2007 |

(Continued)

OTHER PUBLICATIONS

Bürgi, L. et al.: Optical proximity and touch sensors based on monolithically integrated polymer LEDs. In: Organic Electronics, 2006, Band 7(2), S.114-120.

*Primary Examiner* — Kevin Pyo
(74) *Attorney, Agent, or Firm* — Cozen O'Connor

(57) ABSTRACT

An optical sensor having at least one optical transmitting unit for production of a transmitted light beam, a photosensitive flat detector with semitransparent characteristics, through which the transmitted light beam passes, and which re-receives reflection light beams, i.e., from an object, and an evaluation unit for the photoelectric current of the photosensitive flat detector, at least for detection of an object. The photosensitive flat detector advantageously includes an organic polymer layer comprising a photosensitive substrate. An "Organic Photosensitive Diode" (OPD) is particularly advantageously used as the photosensitive flat detector with semitransparent characteristics.

7 Claims, 3 Drawing Sheets

(56) References Cited

U.S. PATENT DOCUMENTS

| | | | |
|---|---|---|---|
| 6,037,644 | A | 3/2000 | Daghighian et al. |
| 6,872,970 | B2 | 3/2005 | Halls |
| 2002/0119297 | A1 | 8/2002 | Forrest et al. |
| 2003/0094566 | A1 | 5/2003 | Hamalainen et al. |
| 2005/0156910 | A1 | 7/2005 | Brabec |

FOREIGN PATENT DOCUMENTS

| | | |
|---|---|---|
| DE | 10 2007 027457 | 12/2008 |
| DE | 10 2008 039 345 | 2/2010 |
| EP | 0 371 326 | 6/1990 |
| EP | 1 313 222 | 5/2003 |
| EP | 1 467 224 | 10/2004 |
| JP | 63-112359 | 5/1988 |
| JP | 05-175545 | 7/1993 |
| JP | 2002-055174 | 2/2002 |
| JP | 2002-523904 | 7/2002 |
| WO | WO 00/11725 | 3/2000 |
| WO | WO 2007/137931 | 12/2007 |
| WO | WO 2008/152027 | 12/2008 |

\* cited by examiner

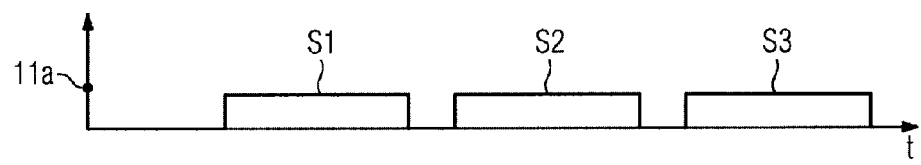
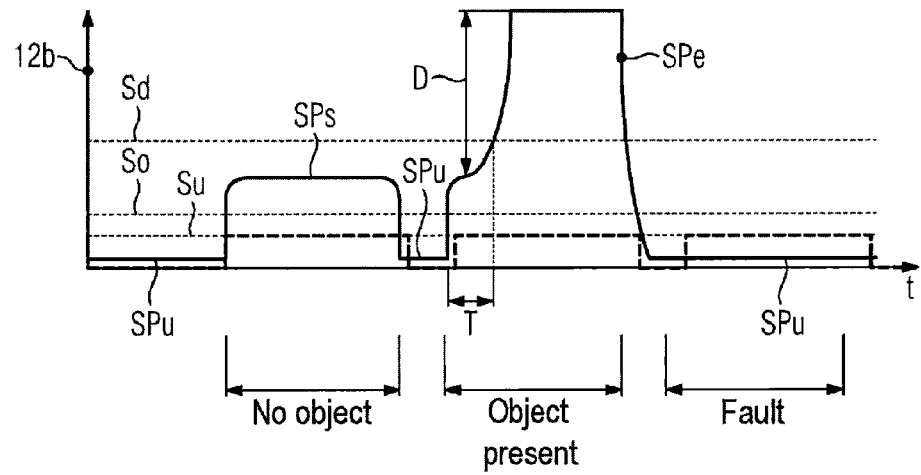

OPTICAL SENSOR COMPRISING A PROXIMITY SWITCH

CROSS-REFERENCE TO RELATED APPLICATIONS

This is a U.S. national stage of application No. PCT/EP2010/063847 filed 21 Sep. 2010. Priority is claimed on German Application No. 10 2009 042 609.4 filed 23 Sep. 2009, the content of which is incorporated herein by reference in its entirety.

BACKGROUND OF THE INVENTION

1. Field of the Invention

The invention relates to sensors and, more particularly, to an optical sensor.

2. Description of the Related Art

It is known to use an optical sensor, for example, as a proximity switch, a light barrier or in a light grid, a light curtain or a laser scanner.

High demands in terms of accuracy are imposed on such a sensor. In order to meet these demands, it is conventional practice to subdivide the transmission light beam inside an optical sensor into a measuring light beam and a reference light beam using optics, i.e., prisms or a semitransparent mirror. Whereas the measuring light beam is emitted into a detection area and, if a measurement object is present, is reflected at the measurement objects as reflection light beams, the reference light beam is evaluated inside the sensor, for example, for the purpose of synchronization and calibration. For this purpose, the reference light beam is supplied to a detector with the aid of further optical elements, for example, a deflecting mirror and optical waveguides, and is accordingly evaluated using downstream components. In addition, conventional optical sensors often have transmitting and receiving optics that are separate from one another.

Consequently, it is possible to synchronize the measurement, for example, because after the reference light beam has been evaluated, the beginning and end of the emission of the transmission light beam and thus also the periods of time in which the reception of reflection light beams can be expected are fixed. If reflection light radiation is received outside these periods of time, this may only be undesirable extraneous light radiation. This also makes it possible to calibrate the sensor with respect to the insensitivity to extraneous light. Furthermore, this is particularly important when the transmission light beam from the optical sensor is pulsed or coded to avoid crosstalk from adjacent sensors. In other embodiments, the distance to a measurement object can also be determined by comparing the reference light beam with arriving reflection light beams, for example, using interference measuring methods.

In the case of an optical sensor used in safety technology, the reference light beam branched from the transmission light beam can also be used to monitor the function of the sensor. In this case, not only the functionality of the apparatus for generating the transmission light beam, for example, an LED or laser transmitting unit, but also the detector and the downstream electronics can be checked. Furthermore, the contamination of the optics of optical sensors used in an industrial environment can be monitored, in particular, with the aid of an inner reference light beam.

These known optical sensors have a wealth of disadvantages. The optical elements needed to subdivide the transmission light beam into a measuring light beam and a reference light beam and also the electrical elements needed to evaluate the reference light beam thus give rise to particular expenditure. In addition, the transmission light beam is attenuated by the beam subdivision, with the result that the apparatuses intended to generate the transmission light beam possibly must have larger dimensions to emit a sufficiently strong measuring light beam.

Another disadvantage is seen in the separate drive means for the elements for generating the transmission light beam and the elements for evaluating the reference and reflection light radiation, including the transmitting and receiving optics that are separate from one another. In order to achieve a sufficient degree of measurement accuracy, considerable measures for calibrating the individual light signals and for synchronizing the signal propagation times must be provided in such a case.

SUMMARY OF THE INVENTION

It is therefore an object of the invention to provide an optical sensor that is free of the above-described disadvantages.

This and other objects and advantages are achieved in accordance with the invention by providing an optical sensor in which use is advantageously made of a photosensitive area detector that has semitransparent properties, is both irradiated by the transmission light beam from the optical transmitting unit, and is used as a receiver for the reflection light radiation reflected by an object. There is thus virtually only one beam course whose light intensity is detected both as emission in the form of the transmission light beam and as reflection in the form of reflection light radiation by a single photosensitive area detector and is evaluated in downstream electronics.

The presently disclosed embodiment provides a wealth of advantages. A beam subdivision is performed in the optical sensor in accordance with the invention using optical elements that are distributed in an appropriate manner. As a result, the transmission light beam has a considerably higher transmission power, with the result that the optical transmitting unit for generating the beam can have smaller dimensions. The photosensitive area detector provides a common detector area both for the light emanating from the sensor and for the light incident in the sensor. As a result, common or conventional optics are sufficient.

A particular advantage of this arrangement is that, on account of the fact that both light levels are measured using the same photosensitive area detector, these light levels can be directly correlated with one another without previous correction factors in evaluation operations. Furthermore, there is no need for any synchronization between the drive device for the transmitting unit and the evaluation unit at the output of the area detector because the temporal transmission information is contained in the single transmission and reflection light beam traveling back and forth. Therefore, only a single evaluation unit is required for the analog measurement signals from the photosensitive area detector. Finally, there is also no need for a separate monitoring unit for the optical transmitting unit for generating the beam. Rather, the function of the transmitting unit can likewise be monitored via the photosensitive area detector and the downstream evaluation unit.

In accordance with an advantageous embodiment of the invention, the photosensitive area detector has an organic polymer layer as a photosensitive substrate. Here, the photosensitive area detector may particularly advantageously comprise an "organic photosensitive diode" (OPD). Such an element provides the advantage of simultaneously detecting a transmission signal and a reception signal without optical deflecting units. This is because the transparent organic photosensitive detector converts only part of the incident transmission light beam into electrical signals, while a large part of the light radiation penetrates the detector in the manner of a measuring light beam. The desired transparency of the detector in each case can be set in the production method for organic photosensitive detectors with layer thicknesses for the anode, cathode, polymer etc. in the submicrometer range, i.e., several 100 nm.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention and particularly advantageous embodiments of the latter are explained in more detail below using FIGS. 1 to 4, in which:

FIG. 3 shows a graphical plot of three exemplary drive pulses for generating pulsed transmission light beams of the transmitting unit;

FIG. 4 shows a graphical plot of the signal levels of the analog measurement signal current which belong to the drive pulses from FIG. 3 and are caused in the measurement signal line of the area detector in three exemplary different applications.

DETAILED DESCRIPTION OF THE PREFERRED EMBODIMENTS

Figure 1:
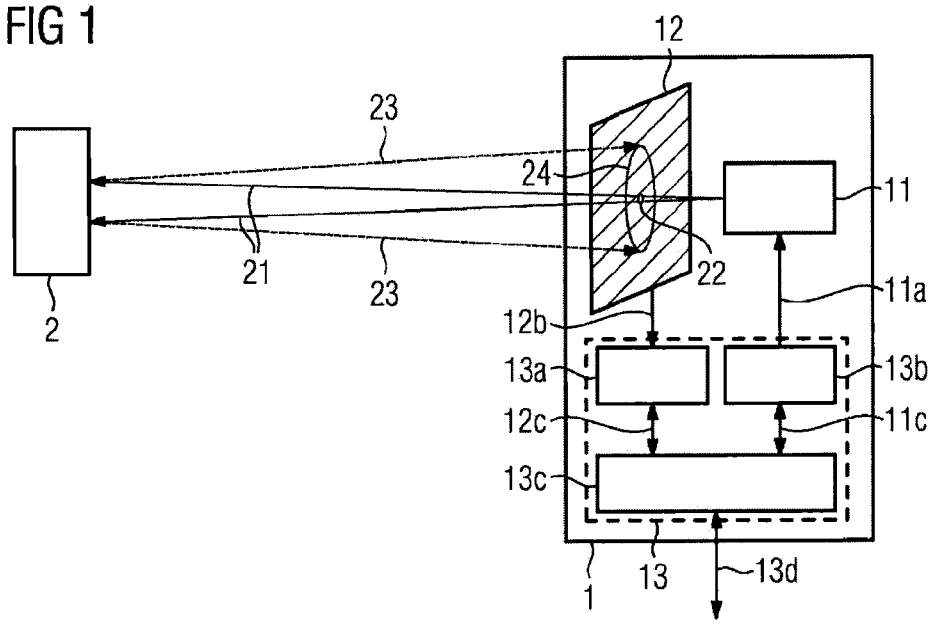
FIG. 1 shows a block diagram of an exemplary, schematic structure of an optical sensor in accordance with the invention.

FIG. 1 shows a block diagram of the schematic structure of an exemplary optical sensor 1 in accordance with the invention. The sensor comprises an individual sensor 1 with an approximately punctiform monitoring region. Here, the sensor 1 contains a photosensitive area detector 12 which has semitransparent properties and is irradiated, virtually from the rear, by an optical transmitting unit 11 with a transmission light beam 21.

This transmission light beam 21 is aimed, in the manner of a measuring light beam, at an object to be detected, at a box 2 in the example in FIG. 1, and causes a transmission light spot 22 on the surface of the photosensitive area detector 12. This light spot is detected by the area detector 12 and is passed, as an actual value of the photoelectric current of the area detector 12, to a controller 13 for further processing via an analog measured value output 12b. The controller can use this measured value to detect, for example, the presence of the transmission light beam and its intensity and can perform function monitoring, for example, in this manner.

If the transmission light beam 21 emitted by the optical transmitting unit 11 impinges on the object 2, the light beam is reflected on the object 2, is reflected to the optical sensor 1, as reflection light radiation 23 and impinges again on the surface of the photosensitive area detector 12 as a reflection light spot 24. This reflection light spot 24 is also detected by the area detector 12 and is passed, as an actual value of the photoelectric current caused thereby in the area detector 12, to the controller 13 for further processing via the analog measured value output 12b. The controller can use this measured value to detect, for example, the presence of an object or its intensity and can perform object detection and distance determination, for example, in this way in the manner of a proximity switch. This is explained in yet more detail using the example in the following figures.

FIG. 1 also illustrates, by way of example, the fundamental elements of an exemplary controller 13. In this case, the photosensitive area detector 12 is connected to an evaluation unit 13a via an analog measured value output 12b. The evaluation unit 13a evaluates the actual value of the photoelectric current of the area detector 12, which actual value is caused by the transmission light beam or by a combination of a transmission light beam and reflection radiation or only by diffuse ambient stray light. An exemplary type of such an evaluation is explained in yet more detail below using FIGS. 3 and 4. The evaluation unit 13a supplies these measured values and possibly additional evaluation results, preferably via a digital data interface 12c, to a control unit 13c which has, for example, a communication interface 13d for connection to a data bus (not shown).

The control unit 13c generally coordinates the interaction between the sensor 1 and the environment, the interaction between the transmitting unit 11 and the detector 12 and the internal monitoring functions of the sensor 1 via the inputs and outputs 12c, 11c and 13d, i.e., preferably via digital data interfaces. The control unit 13c thus parameterizes, for example, a drive device 13b for the transmitting unit 11 such that the drive device 13b emits pulse patterns for the clocked switching-on and switching-off of the beam generation via the drive line 11a.

The pulsation of the transmission light beam 21 makes it possible, for example, to measure the propagation time for the purpose of determining the distance between the sensor 1 and the object 2. Furthermore, it is thus possible to reduce the extraneous light sensitivity of the optical sensor 1 or to comply with prescribed emission classes, for example, in the case of an LED, laser diode or OLED as the transmitting unit 11. For definitive beam generation at the optical interface of the sensor 1, optics may be placed in front of the combined beam path of the transmission and reflection light radiation 21, 23, respectively. Such optics are not illustrated in the figures for reasons of clarity.

With a preferred orientation of the transmitting unit 11 with respect to the photosensitive area detector 12, the transmission light beam 21 impinges on the surface of the photosensitive area detector 12 in an approximately orthogonal manner. If the sensor 1 is oriented in a straight line with respect to the object 2 in this case, the reflection light radiation 21 impinges on the surface of the photosensitive area detector 12, with the formation of a reflection light spot 24, such that the reflection light spot 24 surrounds the transmission light spot 22 in a center in an approximately concentric manner. The photosensitive area detector 12 and the transmitting unit 11 are particularly advantageously oriented such that reflection light beams 23 strike the area detector as axially as possible with respect to the transmission light beam 21.

Figure 2:
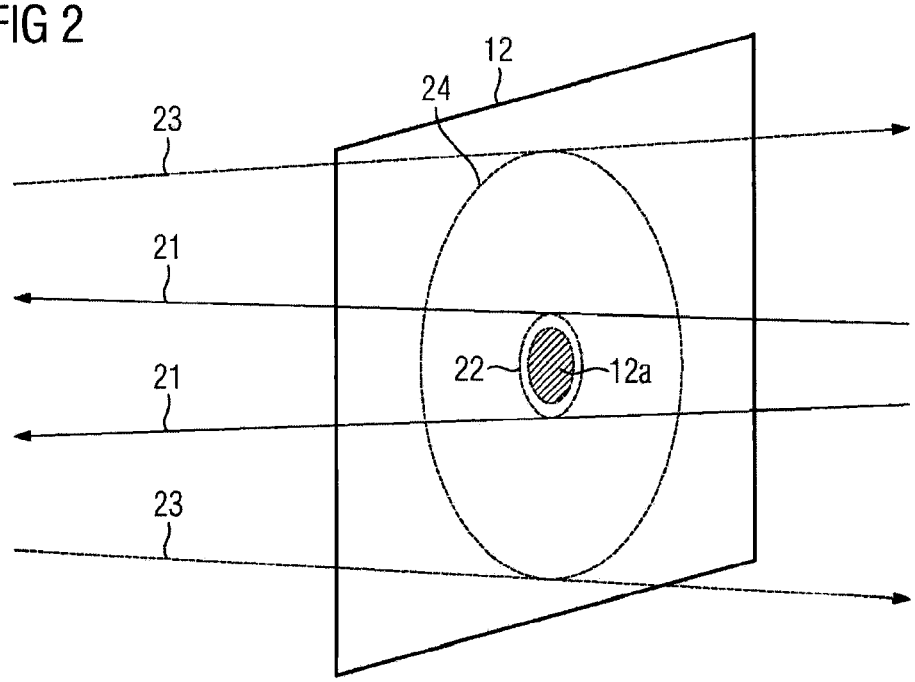
FIG. 2 shows a detailed excerpt for a particularly advantageous embodiment of a photosensitive detector which has a non-photosensitive inactive area in the passage region for the transmission light beam.

FIG. 2 shows such an arrangement using the example of a perspective side view of the photosensitive area detector 12. In accordance with an advantageous further embodiment of the invention, the area detector 12 has, at that location, an inactive area 12a at which the transmission beam 21 passes to the outside. The area 12a is smaller than the area covered by the transmission light spot 22. As a result, only part of the transmission beam 21 is detected by the sensor 1, while most can pass to the outside undetected and, in particular, without attenuation. This makes it possible to considerably improve the dynamic range of the sensor without additional functions, for example, function monitoring, being restricted thereby. When using an "organic photosensitive diode" (OPD) as the photosensitive area detector, the inactive area 12a can be realized, for example, when producing the transparent detector, by suitable masks for the anode, cathode and the polymeric semiconductor or by a hole in the carrier material.

FIG. 3 shows, by way of example, three drive pulses S1, S2, S3 which are supplied to the transmitting unit 11 via the signal line 11a for the purpose of generating pulsed transmission light beams 21. The signal levels of the analog measurement signal current which are caused thereby in the measurement signal line 12b of the area detector 12 in different applications are illustrated therebelow in FIG. 4.

FIG. 4 thus shows, in the left-hand region, the signal level SPs of the photocurrent for the situation in which, although a transmission light beam is caused by the drive pulse S1, the beam is not reflected owing to a lack of an object in the beam path. In this case, only the level SPs of the transmission light beam is thus measured.

In accordance with an advantageous further embodiment of the invention, threshold values may be provided, for example, by the evaluation unit 13a for better evaluation of the measurement signal. In the example in FIGS. 3 and 4, a lower monitoring light threshold Su, an upper monitoring light threshold So and a detection light threshold Sd at the very top are provided for this purpose, for example.

The measurable signal level of the photocurrent at the far left in FIG. 4 thus undershoots the lower monitoring light threshold Su. Since no transmission light beam is obviously generated in this region on account of the absence of a drive pulse in FIG. 3, this signal level can be caused only by diffuse stray light. Nevertheless, this measured value can be used, for example, by the control unit 13c or the evaluation unit 13a to calibrate the optical sensor 1. In contrast, the signal level SPs exceeds the upper monitoring light threshold So for the duration of the drive pulse S1. A measured value of this magnitude can be used by the control unit 13c or the evaluation unit 13a to determine the proper functionality of the optical sensor 1.

In the central region, FIG. 4 also shows the signal level SPe of the photocurrent for the situation in which a transmission light beam is caused by the drive pulse S2 and is reflected on account of an object in the beam path. In this case, the level of the reflection light beam is added to the level of the transmission light beam, with the result that the upper monitoring light threshold So is exceeded. However, the final signal level SPe is reached only after a delay time that latter corresponds to the propagation time of the transmission light beam 21 to reimpinge on the photosensitive area detector after leaving the sensor and after being reflected at an object. In the example in FIG. 4, this delay time T may be determined, for example, by the evaluation unit 13a from the front edge of the drive pulse S2 and the time at which the measured level exceeds the upper monitoring light threshold So. The distance between the sensor 1 and the object 2 can be determined by the evaluation unit 13a, for example, with the aid of the speed of light and the measured value of the delay time T.

FIG. 4 also shows the dynamic range D of the sensor, i.e., the difference between the signal level SPs of the transmission light beam and the maximum signal level SPe in the case of an object in the transmission light beam. In order to increase the dynamic range D, the photosensitive area detector can be provided with a non-sensitive inactive area, as already explained using the example from FIG. 2.

Finally, in the right-hand region, FIG. 4 shows the signal level SPu of the photocurrent for the situation in which, despite a drive pulse S3, no transmission light beam is caused, for example, because of a defect in the sensor 1. A signal level SPu which is below the monitoring light threshold Su and is at best caused by ambient stray light can be detected in this case. As a result, the control unit 13c, for example, can generate diagnostic messages which signal, for example, total failure of the transmitting unit or an impermissible fall in the transmission power caused by ageing.

Figure 5:
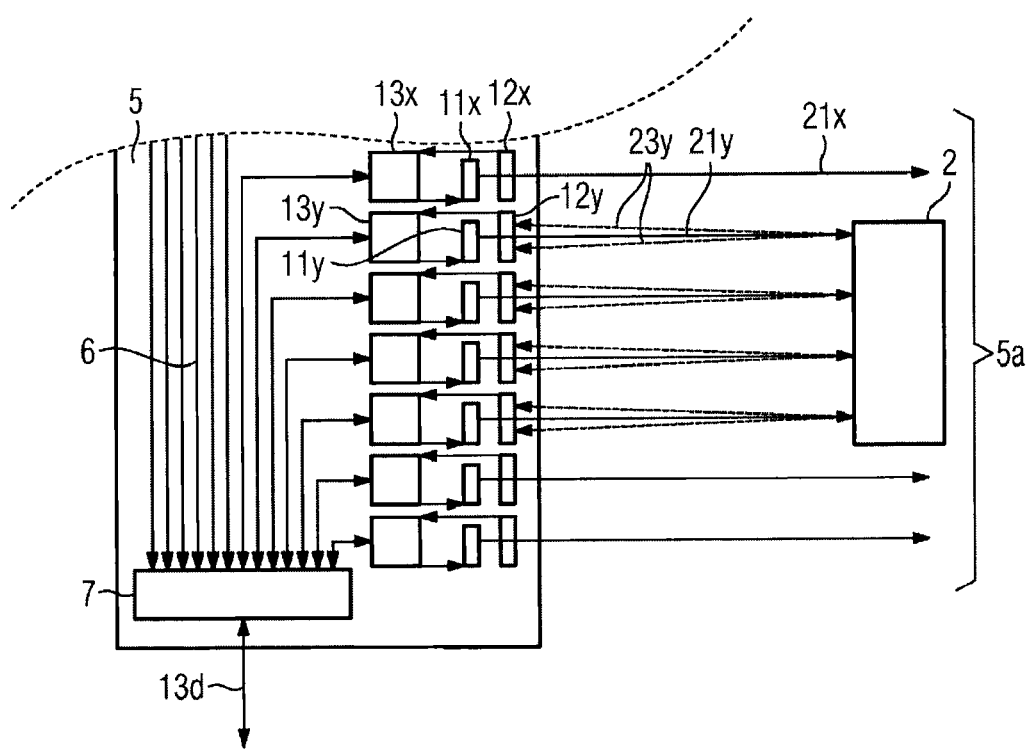
FIG. 5 shows a parallel arrangement of optical sensors in accordance with the invention in the form of an optical curtain.

FIG. 5 finally shows an advantageous parallel arrangement of optical sensors in accordance with the invention in the form of an optical curtain. In the case of such an exemplary cascaded embodiment of the invention, a multiplicity of individual sensors are arranged beside one another in a sensor 5, with the result that the transmission light beams generated by the individual sensors form a type of light curtain Sa.

The example in FIG. 5 thus shows a state in which, for example, an object 2 virtually "in the curtain" is detected by four individual sensors of the sensor 5 by virtue of the reflection of their transmission light beams, while the transmission light beams from the other individual sensors go past the object. For example, the transmission light beam 21x from the upper individual sensor, which has an optical transmitting unit 11x, a photosensitive area detector 12x irradiated by the optical transmitting unit 11x and a common subcontroller 13x in accordance with the invention, goes past the object 2. In contrast, the transmission light beam 21y from the sensor underneath, which likewise has an optical transmitting unit 11y, a photosensitive area detector 12y irradiated by the latter and a common subcontroller 13y in accordance with the invention, impinges on the object 2. The reflection light radiation 23y produced in the process is likewise detected by the area detector 12y and is processed in the manner described above.

In the example in FIG. 5, the measured values from the individual sensors are finally transmitted to a central controller 7 for further processing via communication links 6. This controller may in turn communicate with superordinate observation and control units via a communication interface 13d and a data bus.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An optical sensor, comprising:
   a) an optical transmitting unit configured to generate a transmission light beam;

b) a photosensitive area detector having semitransparent properties, being irradiated by the transmission light beam, and is configured to receive reflection light beams from an object, said transmission light beam creating a transmission light spot on a surface of the photosensitive area detector which is at least partially detected by the photosensitive area detector; and c) an evaluation unit configured to process photoelectric current of the photosensitive area detector at least to detect the object.

2. The optical sensor as claimed in claim 1, wherein the photosensitive area detector and the transmitting unit are oriented such that the reflection light beams strike an area of the photosensitive area detector substantially axially with respect to the transmission light beam.

3. The optical sensor as claimed in claim 1, wherein the photosensitive area detector includes a non-photosensitive inactive area in a passage region for the transmission light beam; and wherein the non-photosensitive inactive area is smaller than an area covered by the transmission light spot created on the surface of the photosensitive area by the transmission light beam.

4. The optical sensor as claimed in claim 2, wherein the photosensitive area detector includes a non-photosensitive inactive area in a passage region for the transmission light beam; and wherein the non-photosensitive inactive area is smaller than an area covered by the transmission light spot created on the surface of the photosensitive area by the transmission light beam.

5. The optical sensor as claimed in claim 1, wherein the photosensitive area detector includes an organic polymer layer comprising a photosensitive substrate.

6. The optical sensor as claimed in claim 5, wherein the photosensitive detector comprises an organic photosensitive diode (OPD) having semitransparent properties.

7. The optical sensor as claimed in claim 1, wherein the optical sensor is a proximity switch.

* * * * *